(12) United States Patent  
Chiang et al.

(10) Patent No.: US 7,265,952 B2
(45) Date of Patent: Sep. 4, 2007

(54) TWO-TERMINAL PROTECTING CIRCUIT

(75) Inventors: Yung-Hsin Chiang, Taipei Hsien (TW); Lai-Hua Luo, Xi-An (CN)

(73) Assignee: ADDtek Corp., Songshan District, Taipei (TW)

( * ) Notice: Subject to any disclaimer, the term of this patent is extended or adjusted under 35 U.S.C. 154(b) by 320 days.

(21) Appl. No.: 11/160,109

(22) Filed: Jun. 9, 2005

(65) Prior Publication Data

US 2006/0279262 A1  Dec. 14, 2006

(51) Int. Cl.
*H02H 3/00* (2006.01)
*H02H 3/20* (2006.01)

(52) U.S. Cl. .......................................... 361/8; 361/91.5
(58) Field of Classification Search .................. 361/1, 361/8, 13, 18–20, 54, 57, 91.1, 91.5; 315/71, 315/75, 119, 121–122, 125, 128–129, 136
See application file for complete search history.

(56) References Cited

U.S. PATENT DOCUMENTS

| | | | | |
|---|---|---|---|---|
| 5,731,941 A | * | 3/1998 | Hargrove et al. | 361/56 |
| 5,847,593 A | * | 12/1998 | Pernyeszi | 327/432 |
| 6,778,001 B2 | * | 8/2004 | Mayama et al. | 327/427 |
| 6,803,633 B2 | * | 10/2004 | Mergens et al. | 257/358 |
| 6,940,416 B2 | * | 9/2005 | Hudson et al. | 340/663 |
| 2002/0116033 A1 | * | 8/2002 | Greatbatch et al. | 607/33 |
| 2004/0043742 A1 | * | 3/2004 | Beumer | 455/323 |
| 2004/0212939 A1 | * | 10/2004 | Casey | 361/57 |

* cited by examiner

*Primary Examiner*—Shih-Chao Chen
*Assistant Examiner*—Minh Dieu A
(74) *Attorney, Agent, or Firm*—Winston Hsu

(57) ABSTRACT

An integrated circuit provides a load with back-flow and open-circuit protection and includes a load, a trigger circuit, and a shunt circuit. The integrated circuit provides large-size LED displays having series LED connection with back-flow and open-circuit protection. The shunt circuit of the integrated circuit shunts the back-flow current from the LED when an ESD is applied, and offers an alternative current path when an LED fails so that other functioning LEDs can still emit light.

31 Claims, 11 Drawing Sheets

TWO-TERMINAL PROTECTING CIRCUIT

BACKGROUND OF THE INVENTION

1. Field of the Invention

The invention relates to an integrated circuit having a load, and more particularly, to a two-terminal protecting circuit for protecting a light emitting device with back-flow and open-circuit protection, and an integrated circuit integrating the light emitting device and protecting circuit.

2. Description of the Prior Art

Light emitting diodes (LEDs) have found a myriad of applications in many electrical circuits produced for consumer, commercial, industrial and military uses. LEDs are semiconductor devices that convert electrical energy directly into light, and, like many other electrical components, are susceptible to damage or destruction when exposed to excessive currents or voltages. When the need arises, circuits can be designed to provide protection to devices that may encounter the over-currents and over-voltages. Generally speaking, as the sophistication of the protection circuits increase, the cost and reliability are adversely affected.

LEDs are often used as light indicators or other light sources for portable electronic devices such as mobile phones, notebook computers, and personal digital assistants (PDAs). However, there have been increasing demands for LEDs to be applied to larger displays such as large neon signs. Such applications require many LEDs for producing a sufficient amount of light. Since the forward-biased current of an LED increases exponentially with the applied forward-biased voltage, it is desirable to drive LEDs with current sources to achieve matching luminance of different LEDs. Please refer to FIG. 1 for a diagram of a prior art LED circuit 10 used for a large-size display. The LED circuit 10 includes a plurality of light emitting diodes LED1-LEDn, an applied voltage VDD, and a current source Is. The LED1-LEDn are coupled in parallel and driven with the same current source Is. The sum of the current passing through each LED is equal to the current provided by the current source Is. Therefore, if one of the LEDs in the LED circuit 10 fails, its current will be shunted to the other LEDs. The more devices among LED1-LEDn that fail, the more the rest of the functioning LEDs are prone to fail due to increased passing current. This kind of avalanche failure greatly shortens the lifetime of the LED circuit 10.

Please refer to FIG. 2 for a diagram of another prior art LED circuit 20 for a large-size display. The LED circuit 20 includes a plurality of light emitting diodes LED1-LEDn, an applied voltage VDD, and a plurality of current sources Is1-Isn. The LED1-LEDn are each coupled in series with the current sources Is1-Isn, respectively, and each of the LED1-LEDn and its corresponding current source Is1-Isn are coupled in parallel. Unlike the prior art LED circuit 10, each of the LEDs is driven with its own respective current source. In the LED circuit 20, a failing LED does not influence other functioning LEDs. Therefore, the LED circuit 20 can solve the problem encountered by the LED circuit 10. However, since each of the LEDs requires a separate current source, the LED circuit 20 has a complicated structure and is very costly. Additionally, current provided by different current sources also varies, and this results in a different luminous effect from each LED. The LED circuit 20 is costly, complicated, and cannot achieve uniform luminance.

Please refer to FIG. 3 for a diagram of another prior art LED circuit 30 for a large-size display. The LED circuit 30 includes a plurality of light emitting diodes LED1-LEDn and a current source Is. The LED1-LEDn and the current source Is are coupled in series. The LED circuit 30 has a simple structure and only requires one current source. Due to the nature of the series connection, the current passing through each LED is the same, and this results in uniform luminance of each LED. However, if one of the LEDs fails, the current path will be blocked and the LED circuit 30 will not be able to function even if the rest of the LEDs still work. The LED circuit 30 has zero margin for failure of a device and is hardly practical in real applications.

Please refer to FIG. 4 for a diagram of another prior art LED circuit 40 for a large-size display. The LED circuit 40 adopts a plurality of back-flow preventing Zener diodes ZE1-ZEn in parallel with the LED1-LEDn for protecting the LEDs from a surge, such as an ESD surge. For example, when a voltage Vd is established between the two terminals of the LED1, the I-V curve of the Zener diode ZE1 is shown in FIG. 5. When the voltage Vd drops below a voltage Vf of the Zener diode ZE1, the back-flow current, shunted from the LED 1, flows through the Zener diode ZE1, preventing the LED1 from damage. However, Zener diodes ZE1-ZEn only protect the LED1-LEDn from breakdown due to reverse currents passing from the cathodes to the anodes of the LEDs and cannot prevent one failing LED from blocking the forward current.

SUMMARY OF THE INVENTION

It is therefore a primary objective of the claimed invention to provide an integrated circuit providing back-flow and open-circuit protection in order to solve the above-mentioned problems.

According to an exemplary embodiment of the claimed invention, an integrated circuit providing a load with back-flow and open-circuit protection comprises a load, a trigger circuit, a first switch, a second switch and a third switch. The trigger circuit is coupled to the load. The first switch has a first end coupled to a first end of the load, a second end coupled to the trigger circuit, and a third end coupled to a second end of the load. The second switch has a first end coupled to the second end of the load, a second end coupled to the third end of the first switch, and a third end coupled to the second end of the first switch. The third switch has a first end coupled to the second end of the load, a second end coupled to the third end of the first switch, and a third end coupled to the first end of the load.

According to another exemplary embodiment of the claimed invention, an integrated circuit providing a load with back-flow and open-circuit protection comprises a shunt circuit and a trigger circuit. The shunt circuit is coupled in parallel with a load, and has a first and second end coupled to a first and second end of the load, respectively, wherein a reverse-blocking current passes through the shunt circuit from the second end to the first end of the shunt circuit when the voltage across the first and second ends of the load is smaller than a junction built-in voltage V0, a first current passes through the load from the first end to the second end of the load and a second current of substantially smaller value than the first current passes through the shunt circuit from the first end to the second end of the shunt circuit when the voltage across the first and second ends of the load is larger than the holding voltage Vh and smaller than a break-over voltage Vbo, and a forward-on current passes through the shunt circuit from the first end to the second end of the shunt circuit when the voltage across the first and second ends of the load is larger than the break-over voltage Vbo. The trigger circuit is coupled to a third end of the shunt circuit for controlling the break-over voltage Vbo.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
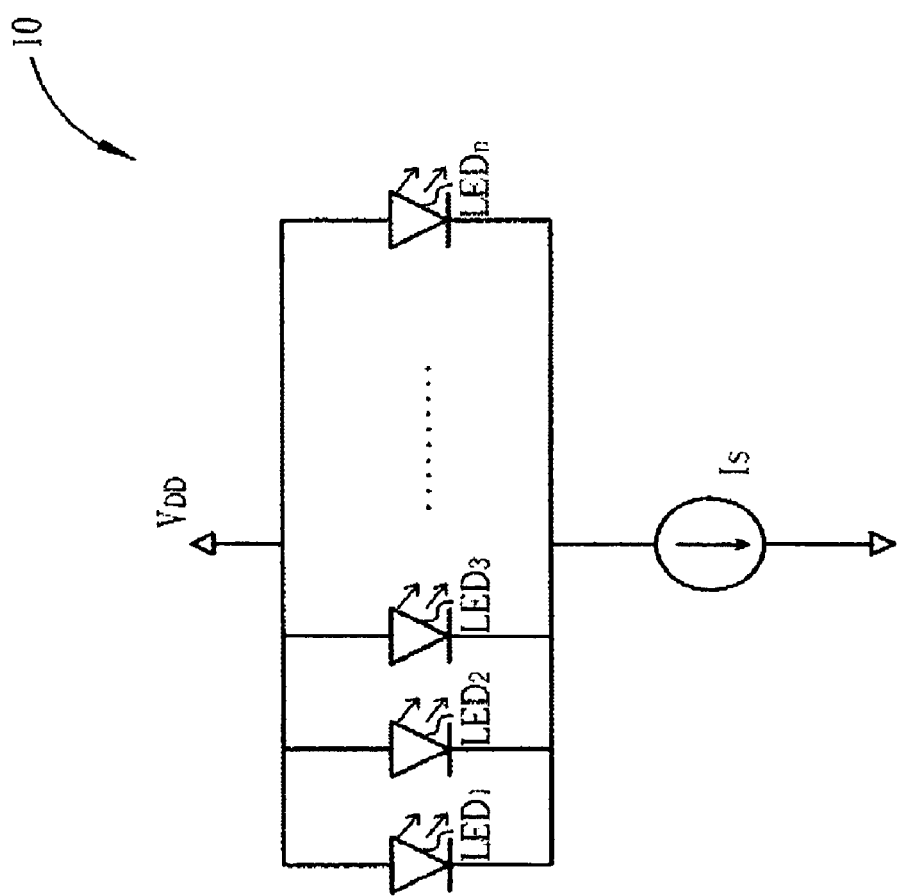
FIG. 1 shows a diagram of a prior art LED circuit.
Figure 2:
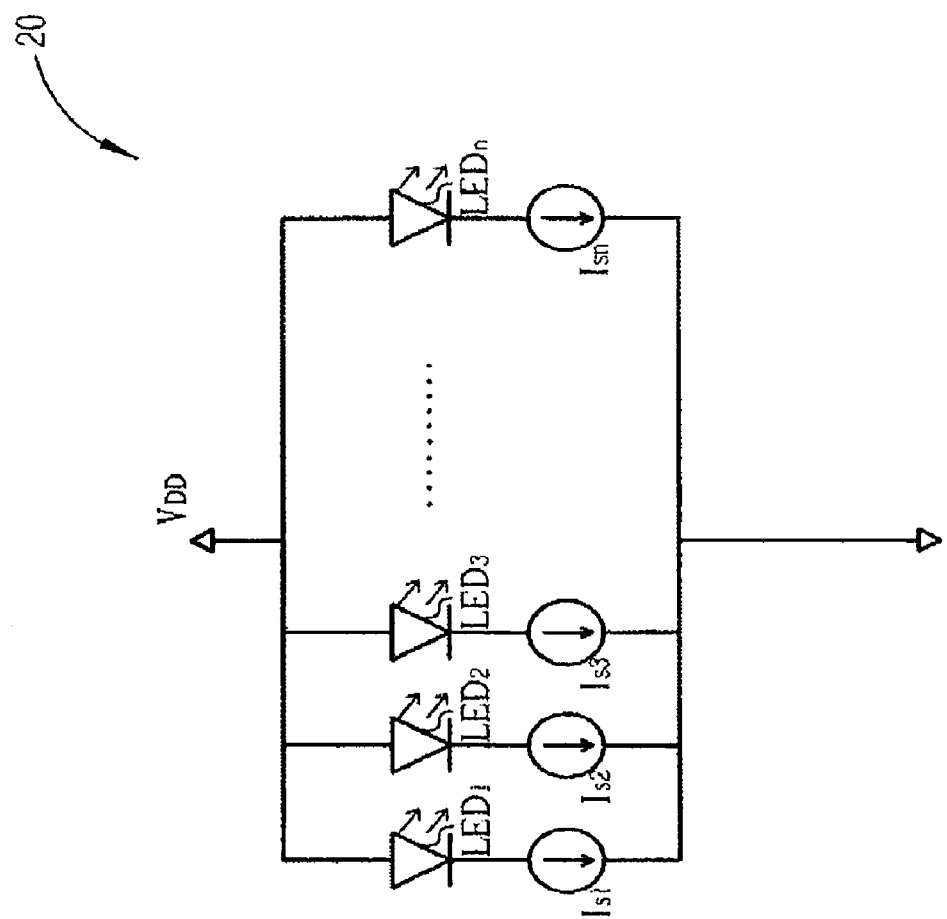
FIG. 2 shows a diagram of another prior art LED circuit.
Figure 3:
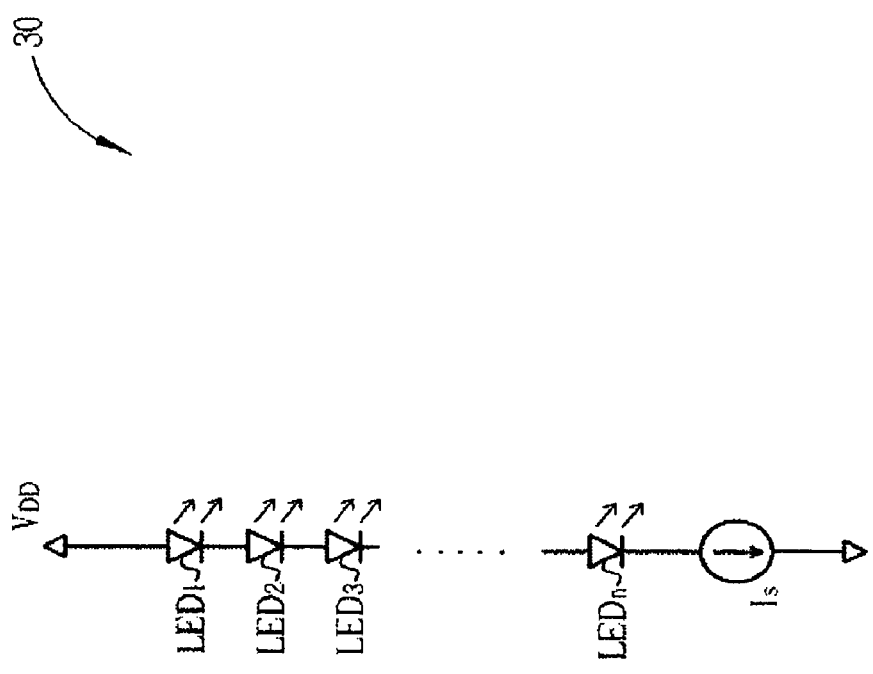
FIG. 3 shows a diagram of another prior art LED circuit.
Figure 4:
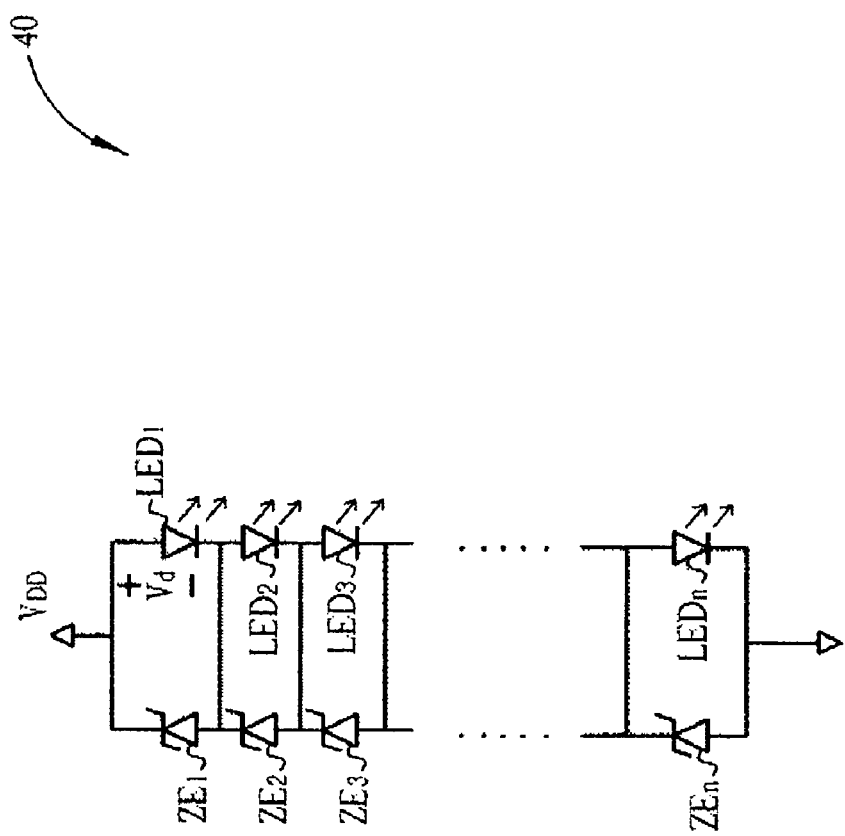
FIG. 4 shows a diagram of another prior art LED circuit.
Figure 5:
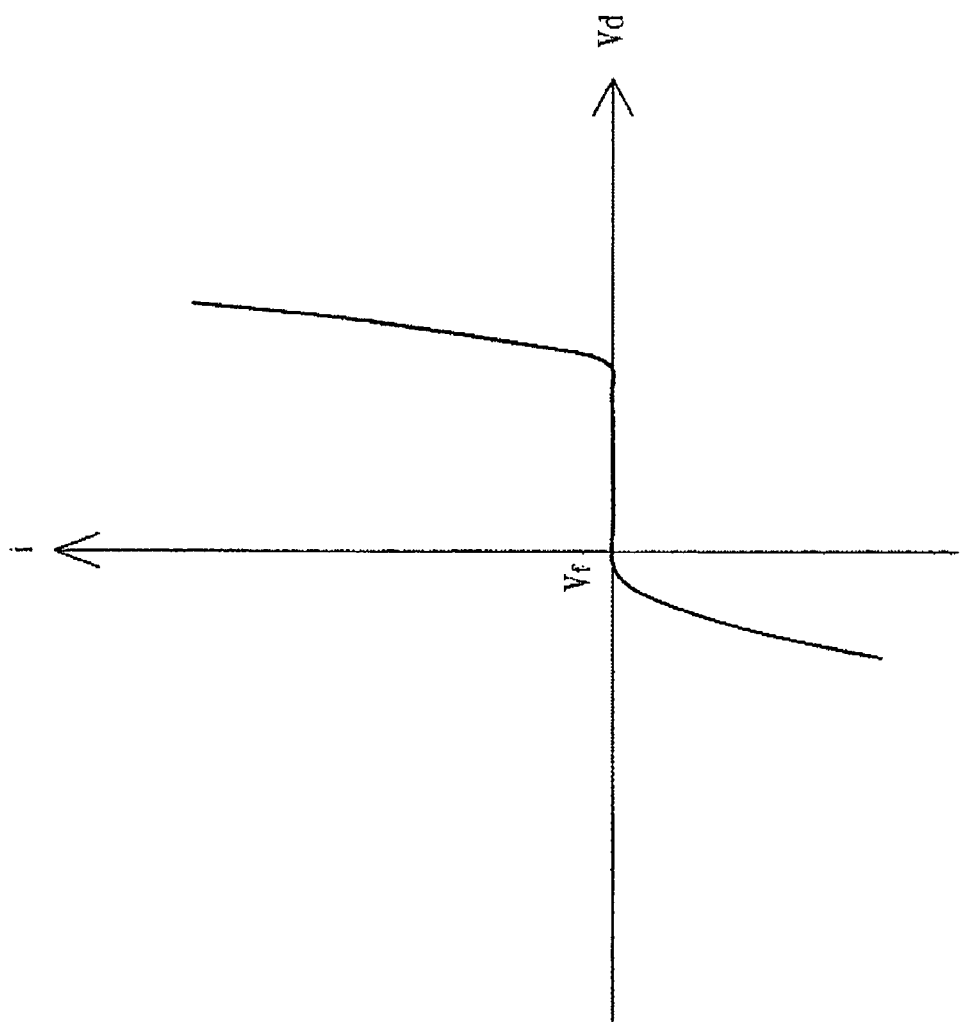
FIG. 5 shows an I-V curve of a Zener diode of the LED circuit in FIG. 4.
Figure 6:
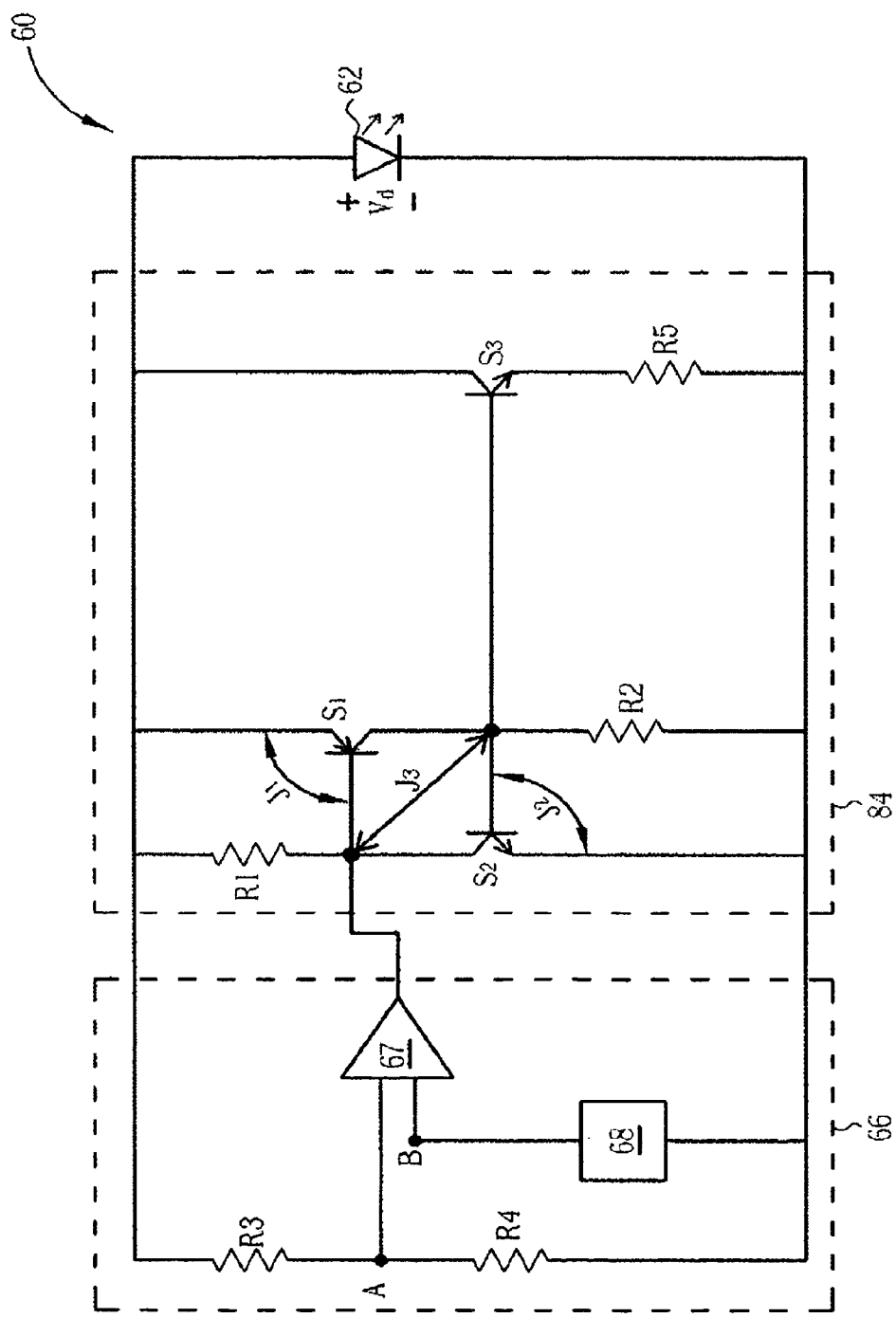
FIG. 6 shows a diagram of an integrated circuit according to a first embodiment of the present invention.

Please refer to FIG. 6 showing an integrated circuit 60 according to a first embodiment of the present invention. The integrated circuit 60 is coupled to an LED 62 and includes a shunt circuit 84 and a trigger circuit 66 formed on a same substrate with the LED 62. The shunt circuit 84 is coupled between an anode and a cathode of the LED 62 and includes switches S1-S3 and resistors R1-R5. The switch S1 is a PNP type bipolar junction transistor (BJT) with an emitter coupled to the anode of the LED 62, a base coupled to the anode of the LED 62 through the resistor R1, and a collector coupled to a base of the switch S2. The switch S2 is an NPN type BJT with an emitter coupled to the cathode of the LED 62, the base coupled to the cathode of the LED 62 through the resistor R2, and a collector coupled to the base of the switch S1. The switch S3 is an NPN type BJT with an emitter coupled to the cathode of the LED 62 through the resistor R5, a base coupled to the collector of the switch S1, and a collector coupled to the anode of the LED 62.

The trigger circuit 66 includes a comparator 67, a reference circuit 68, and resistors R3 and R4. The resistors R3 and R4 are coupled in series between the anode and the cathode of the LED 62. The reference circuit 68 is coupled between the comparator 67 and the cathode of the LED 62. When a voltage obtained at a node A is greater than a voltage provided by the reference circuit 68 at a node B, the comparator 67 provides a trigger voltage at the base of the switch S1.

Figure 7:
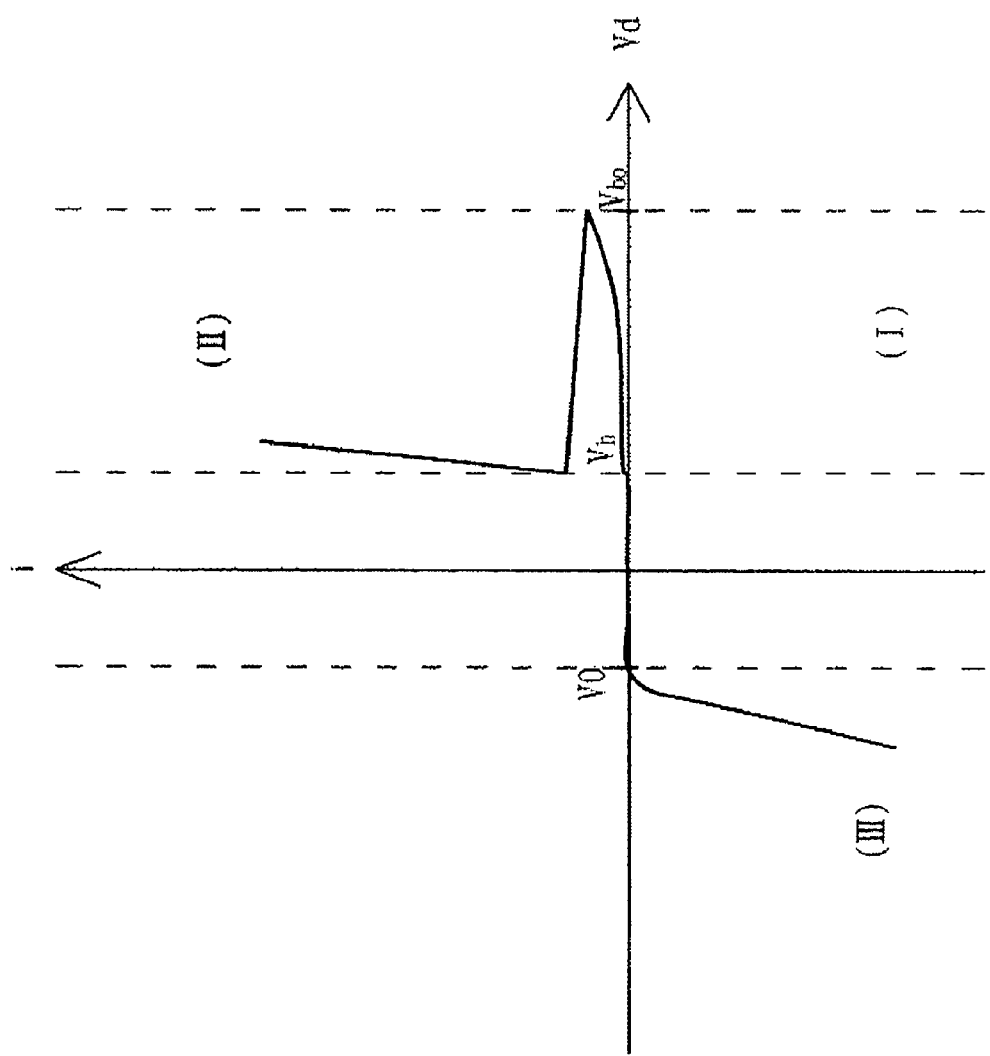
FIG. 7 shows an I-V curve of the integrated circuit in FIG. 6.

Please refer to FIG. 7 for an I-V curve illustrating the current passing through the shunt circuit 84 and the trigger circuit 66 with respect to a voltage Vd established between the anode and the cathode of the LED 62. FIG. 7 illustrates the three working states of the shunt circuit 84 and the trigger circuit 66: a low-current and high-voltage forward-blocking state (I), a high-current and low-voltage forward-on state (II), and a reverse state (III).

The shunt circuit 84 and the trigger circuit 66 work in state (I) when the voltage Vd is between a holding voltage Vh and a break-over voltage Vbo of the shunt circuit 84. The value of the holding voltage Vh can be the same as or smaller than a turn-on voltage of the LED 62. When the voltage Vd exceeds Vh, the LED 62 works in the forward-biased region and conducts the most current. A P-N junction J1 formed between the emitter and the base of the switch S1 and a P-N junction J2 formed between the base and the emitter of the switch S2 are forward-biased, while a P-N junction J3 formed between the bases of the switch S2 and S1 is reversed-biased. Therefore, the switches S1-S3 are turned off and only a negligible amount of current due to leakage passes through the shunt circuit 84 and a small standby current passes through trigger circuit 66. When the LED 62 is working normally, the shunt circuit 84 and the trigger circuit 66 work in state (I).

The shunt circuit 84 and the trigger circuit 66 work in state (II) when the voltage Vd exceeds the break-over voltage Vbo. When Vd is greater than Vbo, the voltage obtained at node A by voltage division through the resistors R3 and R4 exceeds the voltage provided by the reference circuit 68 at node B. The comparator 67 then generates a trigger voltage at the base of the switch S1. The voltage difference established across junction J1 triggers a current that passes from the emitter to the base of S1 and thus turns on the switch S1. Then, a collector current of the switch S1 flows into the base of the switch S2 and through the resistor R2, and thereby turns on S2. A voltage difference established across the resistor R2 keeps the switch S2 in the ON state and turns on the switch S3, and a collector current of the switch S2 subsequently keeps the switch S1 in the ON state. Therefore, even if the trigger voltage from the trigger circuit 66 is removed, the switches S1-S3 still remain on. The shunt circuit 84 and the trigger circuit 66 working in state (II) shunt current from the LED 62 when the voltage Vd exceeds the break-over voltage Vbo. If the LED 62 is burned out and causes an open circuit between the anode and the cathode, the shunt circuit 84 provides another current path for open-circuit protection.

Figure 8:
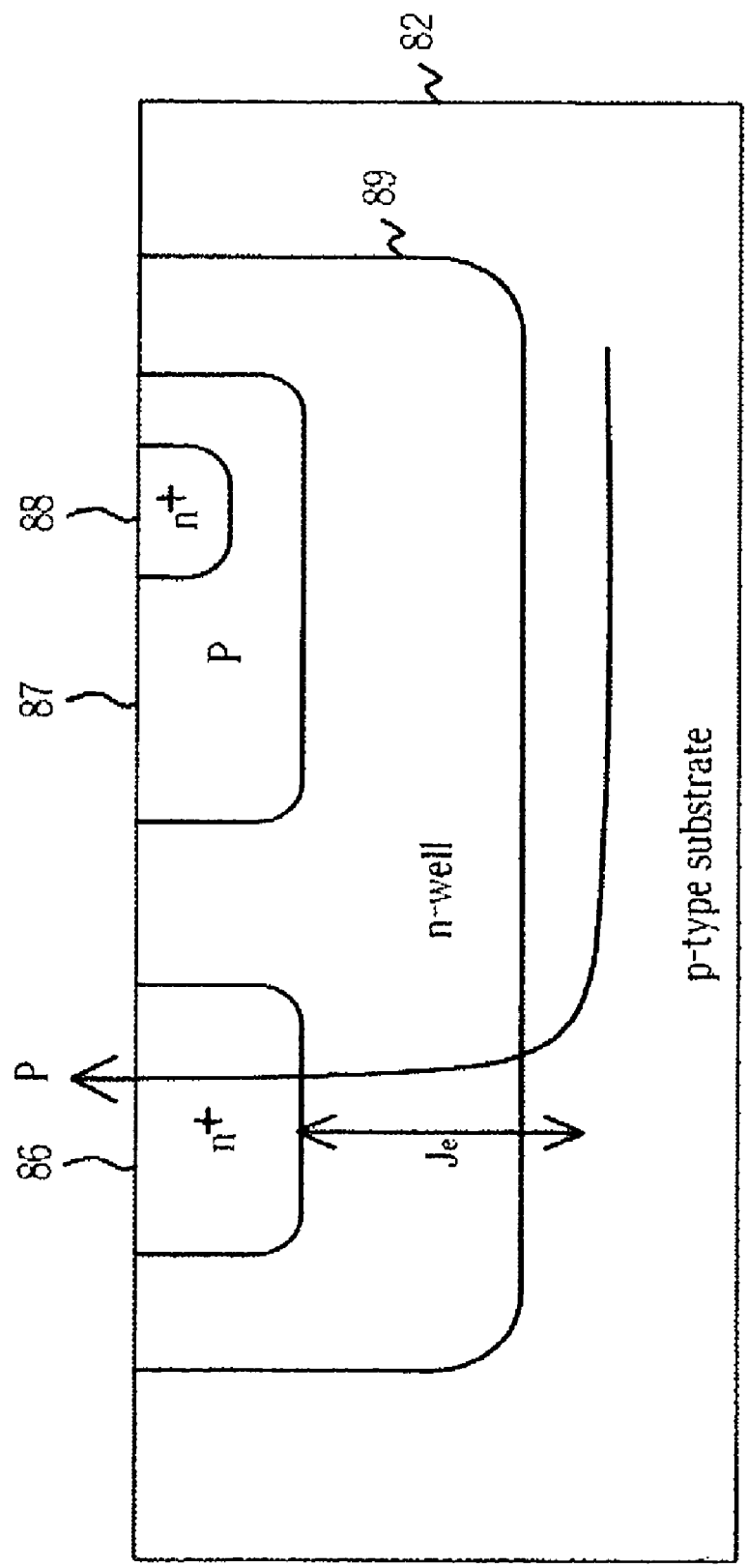
FIG. 8 shows a cross-sectional view of a switch of the integrated circuit in FIG. 6.

Please refer to FIG. 8 for a cross-sectional view of the switch S3. The S3 is formed on a p-type substrate 82 and includes an n-well 89, n-type doped regions 86 and 88, and a p-type doped region 87. The n-well 89 is formed on the substrate 82. The n-type doped region 86 is formed on the n-well 89 and serves as the collector of the switch S3. The p-type doped region 87 is formed on the n-well 89 and serves as the base of the switch S4. The n-type doped region 88 is formed on the p-type doped region 87 and serves as the emitter of the switch S3. The shunt circuit 84 and the trigger circuit 66 work in state (III) when the voltage Vd drops below a junction built-in voltage V0. Since the switch S3 and the LED 62 are both formed on the substrate 82, a voltage established between the anode and cathode of the LED 62 is equivalent to a voltage established between the collector of the switch (the n-type doped regions 86) and the substrate 82. Therefore, when Vd is smaller than V0, the switch S3 is turned off and an equivalent forward-biased P-N junction Je is formed between the substrate 82 and the n-type doped regions 86. The P-N junction Je provides a current path P that allows current to pass through the switch S3 instead of the LED 62 when Vd is smaller than V0.

Figure 9:
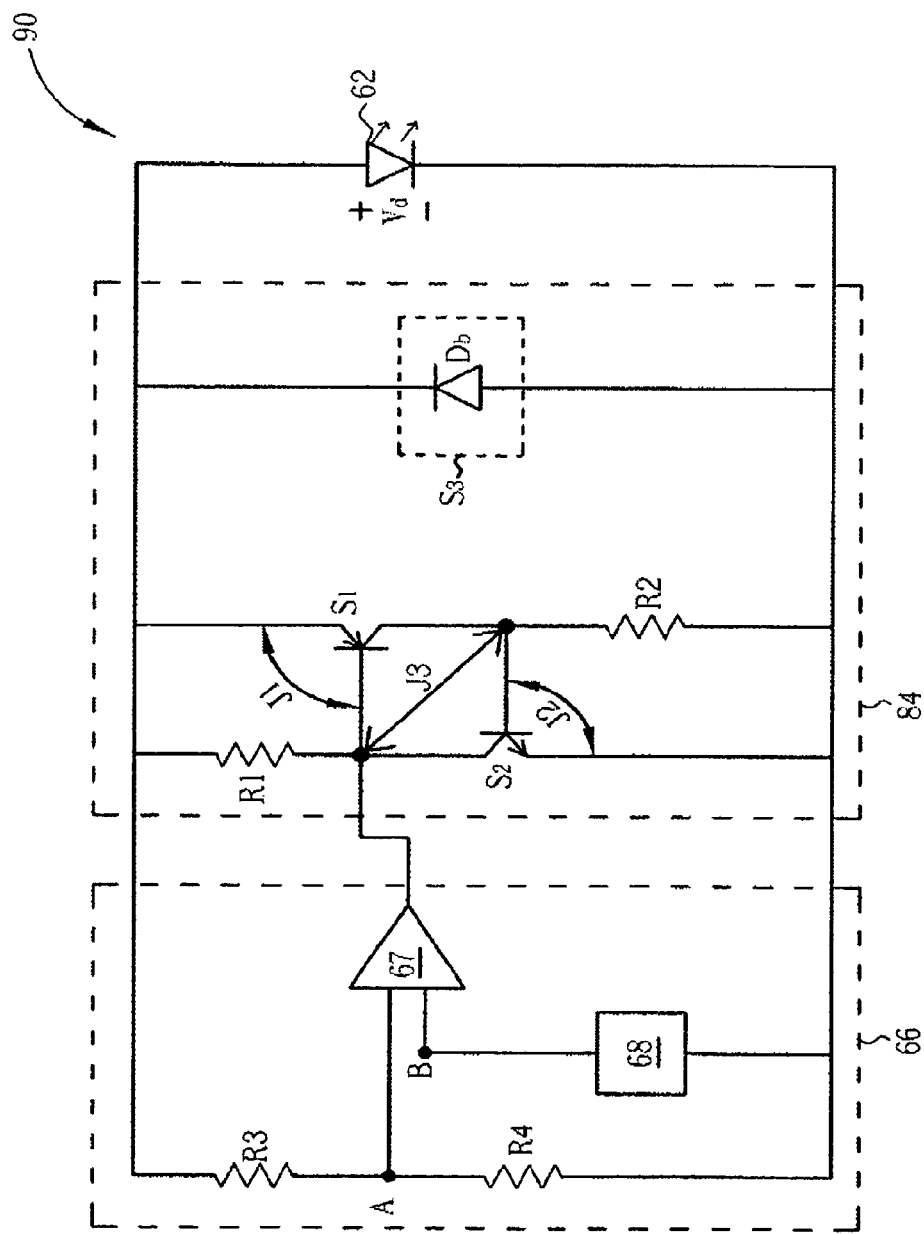
FIG. 9 shows a diagram illustrating an equivalent circuit of the integrated circuit in FIG. 6.

Please refer to FIG. 9 showing an equivalent circuit 90 of the integrated circuit 60 when the shunt circuit 84 and the trigger circuit 66 work in state (III). The shunt circuit 84 and the trigger circuit 66 work in state (III) when the voltage Vd is smaller than the junction built-in voltage V0. In FIG. 9, the P-N junction Je formed between the substrate 82 and the n-type doped regions 86 is represented by a built-in diode Db with an anode coupled to cathode of the LED 62 and a cathode coupled to the anode of the LED 62. The junction built-in voltage V0 depends on doping concentrations of the n-type doped regions 86 and the n-well 84, and the temperature as well. When the integrated circuit 60 is operating at room temperature, V0 is usually between 0.6V to 0.8V without applied external voltages. Therefore, when an ESD surge occurs, the built-in diode Db can be turned on easily and shuts current from the LED 62. Therefore, the shunt circuit 84 and the trigger circuit 66 working in state (III) provide the LED 62 with back-flow protection and prevent the LED 62 from damage possibly due to an ESD surge.

Figure 10:
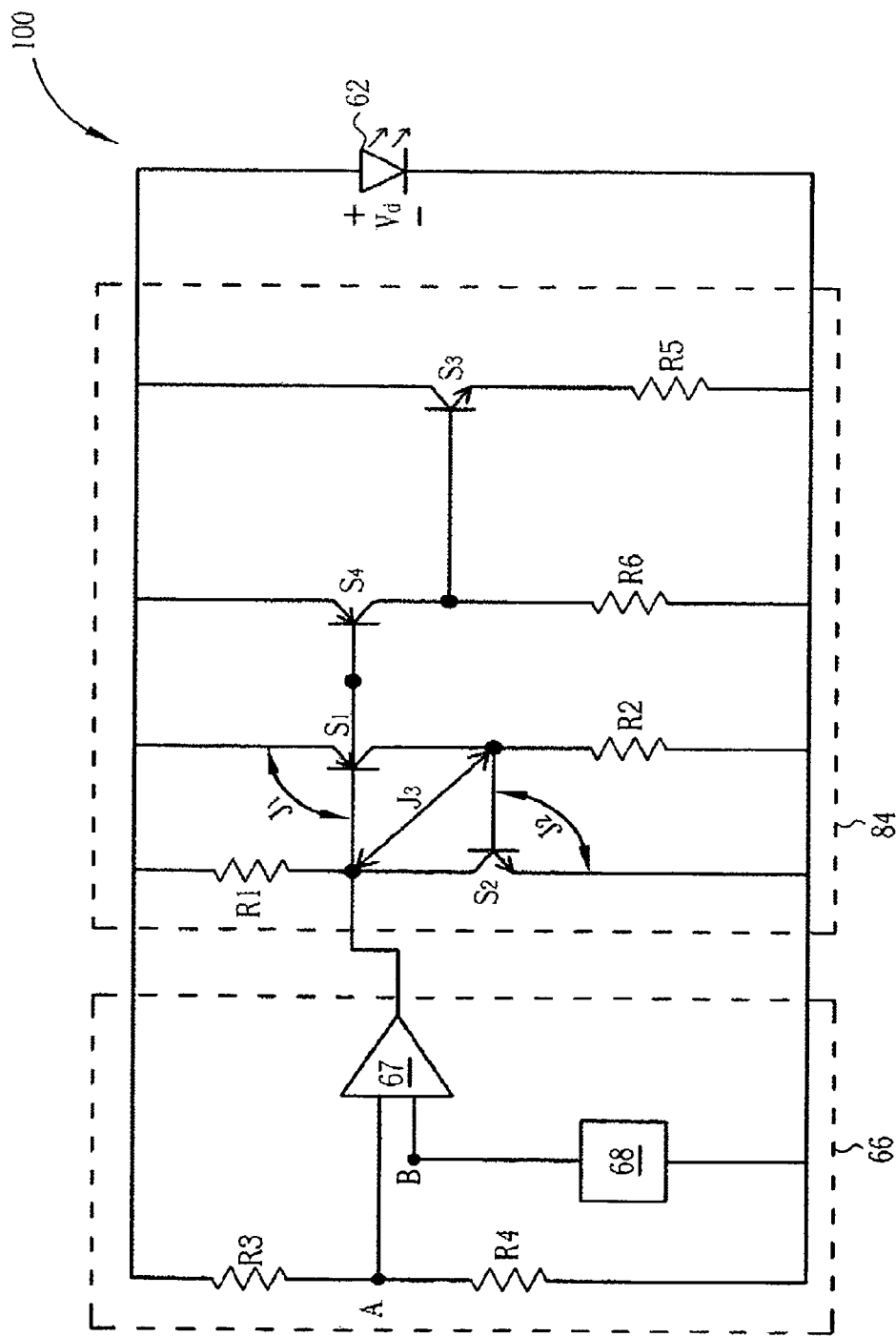
FIG. 10 shows a diagram of an integrated circuit according to a second embodiment of the present invention.

Please refer to FIG. 10 showing an integrated circuit 100 according to a second embodiment of the present invention. The integrated circuit 100 differs from the integrated circuit 60 in that the integrated circuit 100 further includes a switch S4 and a resistor R6. The switch S4 is a PNP type BJT with an emitter coupled to the anode of the LED 62, a base coupled to the base of the switch S1, and a collector coupled to the base of the switch S3 and to the cathode of the LED 62 through the resistor R5. The switch S4 can reduce the time required to turn on the switch S3 when the shunt circuit 84 begins to work in state (II). Therefore, the integrated circuit 100 can provide faster open-circuit protection for the LED 62.

Figure 11:
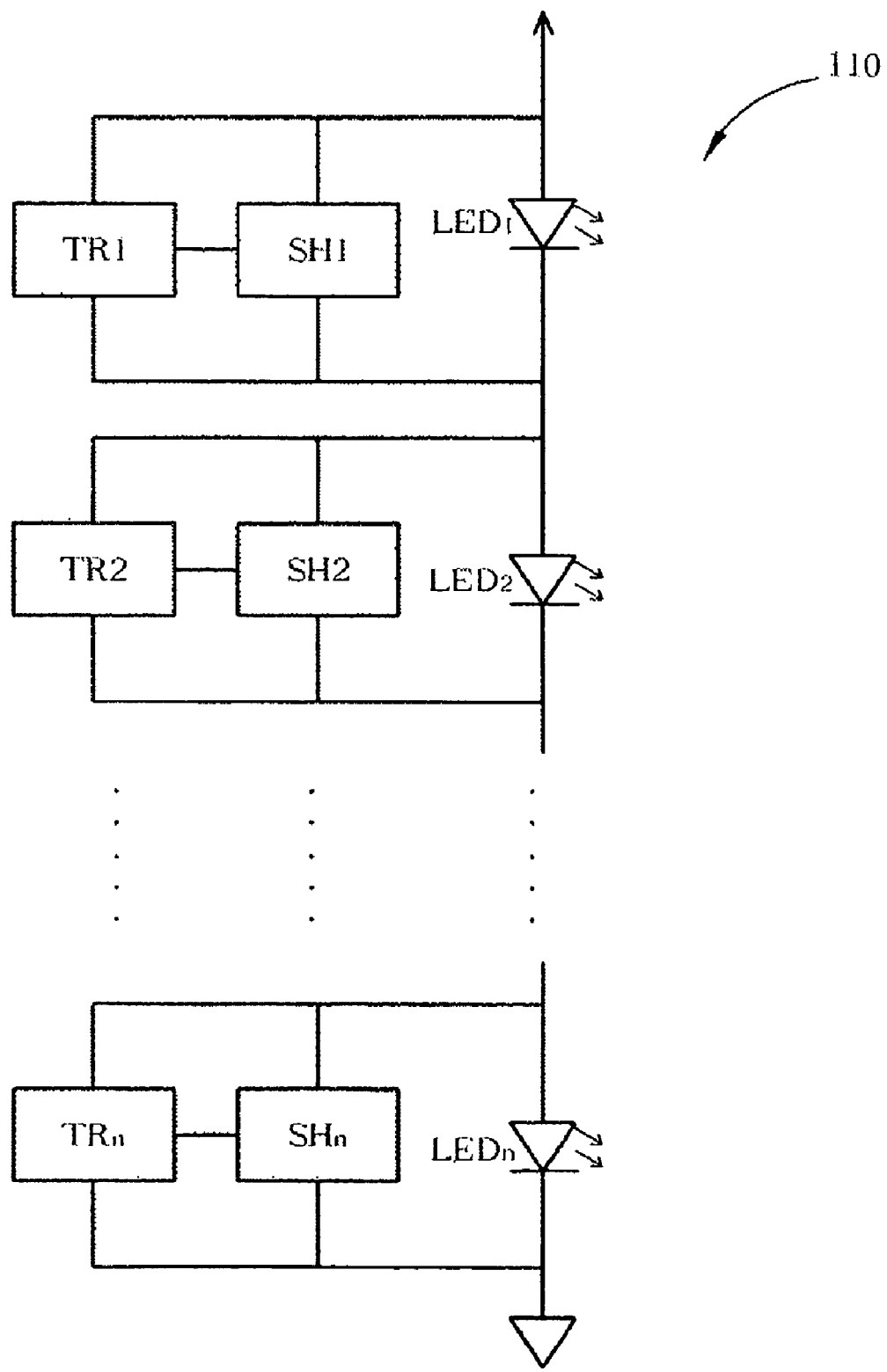
FIG. 11 shows a diagram of an integrated circuit according to a third embodiment of the present invention.

The present invention provides the best protection in circuits having a series connection. Please refer to FIG. 11 showing an integrated circuit 110 according to a third embodiment of the present invention. The integrated circuit 110 comprises a plurality of light emitting diodes LED1-LEDn coupled in series. The LED1-LEDn are coupled to a plurality of shunt circuits SH1-SHn and trigger circuits TR1-TRn, respectively. The shunting circuits 84 and the trigger circuit 66 illustrated in FIG. 6 and FIG. 10 can be adopted in FIG. 11. In the integrated circuit 110, if one of the LEDs fails, the current will pass through its corresponding shunt circuit. Therefore the current will not be blocked by the failing LED and the rest of the functioning LEDs can still emit light. The shunt circuits SH1-SHn also provide their corresponding LEDs with back-flow protection, avoiding possible damage due to an ESD surge.

The embodiments described above are meant to illustrate and not to limit the present invention. The integrated circuits 60 and 100 of the present invention can adopt BJTs for the switches S1-S4, but other devices providing similar functions can also used. The reference circuit 68 in the trigger circuit 66 can adopt, but is not limited to, various types of bandgap reference circuits known by those skilled in the art. In the integrated circuits 60, 100 and 110, the shunt circuits 84 protects the LED 62, as well as other two-terminal devices, with back-flow and open-circuit protection. Also, the LED 62 can be fabricated separately, or formed together with the shunt circuits 84 and the trigger circuit 66 on the same substrate in order to reduce the number of wire-bonding in subsequent processes.

In conclusion, the present invention provides an integrated circuit capable of providing a load with back-flow and open-circuit protection, and is particularly suitable for applications on large-size LED display with series LED connection. The shunt circuit of the present invention integrated circuit shunts the back-flow current from the LEDs when an ESD is present, and offers an alternative current path should an LED fail so that other functioning LEDs can still emit light.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit providing a load with back-flow and open-circuit protection comprising:
   a load;
   a trigger circuit coupled to the load;
   a first switch having a first end coupled to a first end of the load, a second end coupled to the trigger circuit, and a third end coupled to a second end of the load;
   a second switch having a first end coupled to the second end of the load, a second end coupled to the third end of the first switch, and a third end coupled to the second end of the first switch; and
   a third switch having a first end coupled to the second end of the load, a second end coupled to the third end of the first switch, and a third end coupled to the first end of the load.

2. The integrated circuit of claim 1 further comprising a resistor coupled between the second end of the first switch and the first end of the load.

3. The integrated circuit of claim 1 further comprising a resistor coupled between the second end of the second switch and the second end of the load.

4. The integrated circuit of claim 1 further comprising resistor coupled between the first end of the third switch and the second end of the load.

5. The integrated circuit of claim 1 further comprising a fourth switch having a first end coupled to the first end of the load, a second end coupled to the second end of the first switch, and a third end coupled to the second end of the third switch.

6. The integrated circuit of claim 5 further comprising resistor coupled between the third end of the fourth switch and the second end of the load.

7. The integrated circuit of claim 5 wherein the fourth switch is a PNP type BJT.

8. The integrated circuit of claim 1 wherein the first switch is in PNP type BJT.

9. The integrated circuit of claim 1 wherein the second switch is an NPN type BJT.

10. The integrated circuit of claim 1 wherein the third switch is an NPN type BJT.

11. The integrated circuit of claim 1 wherein the trigger circuit comprises:
   a plurality of division resistors coupled in series between the first and second ends of the load;
   a comparator circuit having a first input coupled between two of the division resistors, and an output coupled to the second end of the first switch; and
   a reference circuit coupled between the second end of the load and a second input of the comparator for generating a reference voltage.

12. The integrated circuit of claim 11 wherein the reference circuit is a band-gap reference circuit.

13. The integrated circuit of claim 1 wherein the load is a light emitting diode, the first end of the first switch is coupled to an anode of the light emitting diode, and the first ends of the second and third switches are coupled to a cathode of the light emitting diode.

14. The integrated circuit of claim 1 wherein the protecting circuit and the load are formed on a same substrate.

15. An integrated circuit providing a load with back-flow and open-circuit protection comprising:

a shunt circuit coupled in parallel with a load, the shunt circuit having a first and a second end coupled to a first and second end of the load, respectively, wherein:
  a reverse-blocking current passes through the shunt circuit from the second end to the first end of the shunt circuit when the voltage across the first and second ends of the load is smaller than a junction built-in voltage V0;
  a first current passes through the load from the first end to the second end of the load and a second current of substantially smaller value than the first current passes through the shunt circuit from the first end to the second end of the shunt circuit when the voltage across the first and second ends of the load is larger than the holding voltage Vh and smaller than a break-over voltage Vbo;
  a forward-on current passes through the shunt circuit from the first end to the second end of the shunt circuit when the voltage across the first and second ends of the load is larger than the break-over voltage Vbo; and
a trigger circuit coupled to a third end of the shunt circuit for controlling the break-over voltage Vbo.

16. The integrated circuit of claim 15 wherein the shunt circuit comprises:
  a first switch having a first end coupled to a first end of the load, a second end coupled to the trigger circuit, and a third end coupled to a second end of the load;
  a second switch having a first end coupled to the second end of the load, a second end coupled to the third end of the first switch, and a third end coupled to the second end of the first switch; and
  a third switch having a first end coupled to the second end of the load, a second end coupled to the third end of the first switch, and a third end coupled to the first end of the load.

17. The integrated circuit of claim 16 further comprising a resistor coupled between the second end of the first switch and the first end of the load.

18. The integrated circuit of claim 16 further comprising a resistor coupled between the second end of the second switch and the second end of the load.

19. The integrated circuit of claim 16 further comprising resistor coupled between the first end of the third switch and the second end of the load.

20. Tile integrated circuit of claim 16 further comprising a fourth switch having a first end coupled to the first end of the load, a second end coupled to the second end of the first switch, and a third end coupled to the second end of the third switch.

21. The integrated circuit of claim 20 further comprising resistor coupled between the third end of the fourth switch and the second end of the load.

22. The integrated circuit of claim 20 wherein the fourth switch is a PNP type BJT.

23. The integrated circuit of claim 16 wherein the first switch is a PNP type BJT.

24. The integrated circuit of claim 16 wherein the second switch is an NPN type BJT.

25. The integrated circuit of claim 16 wherein the junction built-in voltage V0 is equal to a voltage required for turning on a PN junction formed between the third end of the third switch and a substrate on which the third switch is formed.

26. The integrated circuit of claim 16 wherein the third switch is an NPN type BJT.

27. The integrated circuit of claim 15 wherein the trigger circuit comprises:
  a plurality of division resistors coupled in series between the first and second ends of the load;
  a reference circuit coupled to the second end of the load for generating a reference voltage; and
  a comparator circuit having a first input coupled between two of the division resistors, a second input coupled to the reference circuit, and an output coupled to the second end of the first switch.

28. The integrated circuit of claim 27 wherein the reference circuit is a band-gap reference circuit.

29. The integrated circuit of claim 15 wherein the first end of the shunt circuit is coupled to an anode of a light emitting diode and the second end of the shunt circuit is coupled to a cathode of the light emitting diode.

30. The integrated circuit of claim 29 wherein the break-over voltage Vbo is larger than a forward-biased voltage of the light emitting diode.

31. The integrated circuit of claim 15 wherein the shunt circuit, the trigger circuit and the load are formed on the same substrate.

* * * * *